(12) United States Patent
Pedersen (10) Patent No.: US 6,300,792 B1
(45) Date of Patent: Oct. 9, 2001

(54) PROGRAMMABLE INPUT/OUTPUT PIN SIGNAL MULTIPLEXING/ DEMULTIPLEXING CIRCUITRY FOR INTEGRATED CIRCUITS

(75) Inventor: Bruce Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/518,010

(22) Filed: Mar. 2, 2000

Related U.S. Application Data
(60) Provisional application No. 60/122,788, filed on Mar. 4, 1999, and provisional application No. 60/142,514, filed on Feb. 6, 1999.

(51) Int. Cl.[7] ........................................... G06F 7/38
(52) U.S. Cl. .................. 326/38; 326/37; 326/41
(58) Field of Search ................... 326/37, 38, 39, 326/41, 47

(56) References Cited

U.S. PATENT DOCUMENTS

| | | | |
|---|---|---|---|
| 3,473,160 | 10/1969 | Wahlstrom | 340/172.5 |
| 5,561,773 | * 10/1996 | Kalish et al. | 395/284 |
| 5,944,813 | 8/1999 | Trimberger | 712/36 |
| 6,020,760 | * 2/2000 | Sample et al. | 326/41 |

OTHER PUBLICATIONS

J. Babb et al.,"Virtual Wires: Overcoming Pin Limitations in FPGA–based Logic Emulators," Proceedings of the IEEE Workshop on FPGAs for Custom Computing Machines '93 (FCCM '93), Apr. 1993.

"Virtual Wires," webmaster @cag.lcs.mit.edu$Date: 1995/02/03, Feb. 3, 1995.

"System Design with New XC4000X I/O Features," Application Note XAPP 056, Nov. 6, 1997 (Version 1.2), Xilinx, Inc., pp. 1–8.

"XC4000E and XC4000X Series Field Programmable Gate Arrays," Product Specification, May 14, 1999 (Version 1.6), Xilinx, Inc., pp. 6–5 through 6–72.

"XC4000XLA/XV Field Programmable Gate Arrays," Product Specification, DS015 (v1.3), Oct. 18, 1999, Xilinx, Inc., pp. 6–157 through 6–170.

* cited by examiner

*Primary Examiner*—Michael Tokar
*Assistant Examiner*—Anh Q. Tran
(74) *Attorney, Agent, or Firm*—Fish & Neave; Robert R. Jackson (57) ABSTRACT

Programmable input/output cell circuitry for use in an integrated circuit and having various programmably selectable modes of operation which may include (1) a first output mode in which one output signal is applied to a pin during each cycle of a clock signal, (2) a second output mode in which two different output signals are time-division multiplexed to the pin during respective halves of the clock signal cycle, (3) a first input mode in which one input signal value is received from the pin during each cycle of the clock signal, and (4) a second input mode in which two time-division multiplexed input signals are received from the pin during respective halves of the clock signal cycle and demultiplexed by the input/output cell circuitry.

18 Claims, 5 Drawing Sheets

PROGRAMMABLE INPUT/OUTPUT PIN SIGNAL MULTIPLEXING/DEMULTIPLEXING CIRCUITRY FOR INTEGRATED CIRCUITS

This application claims the benefit of provisional patent application No. 60/122,788, filed Mar. 4, 1999, and provisional patent application No. 60/142,514, filed Jul. 6, 1999, both of which are hereby incorporated by reference herein in their entireties.

BACKGROUND OF THE INVENTION

This invention relates to increasing the efficiency of utilization of input, output, and/or input/output pins on integrated circuits such as programmable logic devices. (For ease of reference, all pins—whether input, output, or input/output—are generally referred to generically herein as input/output or I/O pins. Also for ease of reference, multiplexing and demultiplexing of signals are both sometimes referred to simply as multiplexing.)

It has been proposed to increase data throughput through I/O pins of integrated circuits by time-division multiplexing data flowing through those pins. Sample et al. U.S. patent 6,020,760, for example, shows integrated circuits such as programmable logic devices in which I/O pins can optionally transmit and/or receive different data signal values in association with each half of each cycle of the circuit's basic clock signal. This is twice the normal data rate, in which only one data signal value is transmitted or received during each full clock signal cycle. Accordingly, the Sample et al. reference shows increased pin utilization efficiency, which can help to alleviate possible shortages of pins in dense integrated circuits. (The Sample et al. reference is hereby incorporated by reference herein in its entirety.)

Circuitry of the type shown in the above-mentioned Sample et al. reference may add signal switching (multiplexing) to circuit paths that may sometimes be needed for speed-critical signals. Such additional multiplexing tends to add delay and may therefore be undesirable for possibly speed-critical circuit paths.

In view of the foregoing, it is an object of this invention to provide improved circuitry for optionally multiplexing signals on I/O pins of integrated circuits.

It is a more particular object of this invention to provide circuitry which allows two data signals to be optionally multiplexed onto a single I/O pin without introducing additional delay into the I/O pin path, especially when the optional multiplexing is not in use and only a single signal is to pass through the I/O pin.

SUMMARY OF THE INVENTION

These and other objects of the invention are accomplished in accordance with the principles of the invention by providing programmable output circuitry having at least two data registers (flip-flops) that can operate either separately (when only a single output signal is to be applied to an associated I/O pin) or together (when two output signals are to be multiplexed onto the associated I/O pin). The two registers are preferably a data output register and a tri-state buffer control signal register. When only a single output signal is to be applied to the I/O pin, the data output register may be used to register that output signal and the tri-state buffer control signal register may be used to register a signal for controlling a tri-state buffer that selectively drives the output signal onto the I/O pin. When two data signals are to be multiplexed onto the I/O pin, one of the data signals is registered by the data output register and the other data signal is registered by the tri-state buffer control signal register and fed out through part of the data output register at the appropriate time. Because the second data signal is fed out through part of the data output register, no additional signal switching or multiplexing is needed downstream from the data output register and no additional signal propagation delay is introduced into what may otherwise be needed for speed-critical output signaling.

For demultiplexing two input signals received via a single I/O pin, a latch (e.g., a level-sensitive latch) is added to input circuitry associated with the I/O pin. The level-sensitive latch is connected in parallel with one of at least two other registers (e.g., a data input register) in the input circuitry, and in series with the other of those two registers (e.g., the above-mentioned tri-state driver control signal register). One of the two multiplexed input signals is sampled and registered by the data input register during one of two halves of each clock signal cycle. The other of the two input signals is detected by the latch during the other of the two halves of each clock signal cycle, and then registered by the tri-state driver control signal register. The two input signals can then be fed out from the two registers in parallel.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
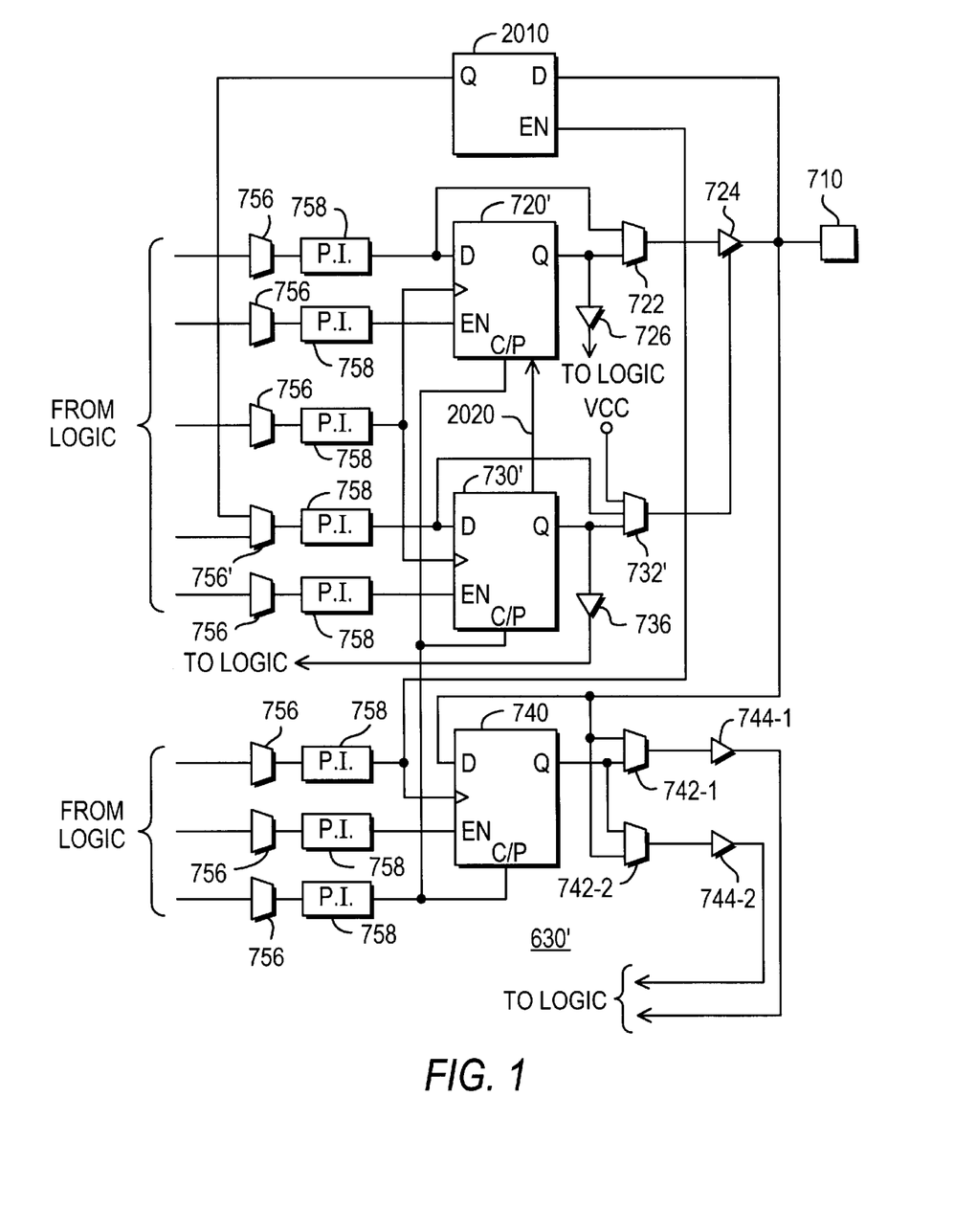
FIG. 1 is a simplified schematic block diagram of an illustrative embodiment of a representative portion of an integrated circuit constructed in accordance with the invention.

FIG. 1 shows programmable I/O cell circuitry 630' constructed in accordance with the invention. I/O cell 630' may be provided on a programmable logic device of the type shown in Ngai et al. U.S. patent application No. 09/516,921, filed Mar. 2, 2000, which is hereby incorporated by reference herein in its entirety. Indeed, parts of the circuitry shown in FIG. 1 are also shown in one of the FIGS. of the immediately above-mentioned reference. In particular, elements in FIG. 1 that are also shown and described in the above-mentioned reference have the same reference numbers in FIG. 1 and the above-mentioned reference. These are generally elements with reference numbers in the 700 series. These elements can be described relatively briefly herein because they are also described in the above-mentioned reference. Elements in FIG. 1 that are somewhat modified from elements shown in the above-mentioned reference have reference numbers that are primed (e.g., reference number 630') in FIG. 1. Elements in FIG. 1 that are not shown in the above-mentioned reference have reference numbers in the 2000 series (e.g., reference number 2000) in FIG. 1.

I/O cell 630' includes data output signal register 720', tri-state driver control signal register 730', and data input signal register 740. The signals coming in from the left (to programmable logic connectors ("PLCs") 756 and 756') typically come from programmable logic or other circuitry on the integrated circuit that includes I/O cell 630' (see, for example, FIG. 4, which shows I/O cell 630' on integrated circuit 10 with other circuitry 20 and an I/O pin 710). Elements 756 and 756' represent circuitry (e.g., programmably controlled multiplexers) for making programmable selections of desired signals (from larger populations of available signals) for use in I/O cell 630'. For example, the top-most PLC 756 is programmable (e.g., by one or more function control elements ("FCEs") (not shown)) to select the data output signal from several possible signal sources available to that PLC. The selected data output signal is applied to the D input terminal of register (flip-flop) 720' via the top-most programmable signal inversion circuit 758. (Each programmable inversion circuit 758 shown in FIG. 1 is programmable (e.g., by an FCE (not shown)) to invert or not invert the signal passing through it.) The second elements 756/758 from the top select a signal for selectively enabling register 720'. The third elements 756/758 from the top select a clock signal for registers 720' and 730'. The fourth elements 756'/758 from the top select a data signal for register 730'. The fifth elements 756/758 from the top select an enable signal for register 730'. The sixth elements 756/758 from the top select a signal for clocking register 740 (and also level-sensitive latch 2010). The seventh elements 756/758 from the top select an enable signal for register 740. And the bottom-most elements 756/758 select a clear/preset signal for application to all of registers 720', 730', and 740.

When I/O cell 630' is not being used to multiplex two output signals onto I/O pin 710 or to receive and demultiplex two multiplexed input signals from that pin, the circuitry shown in FIG. 1 operates as described in the reference mentioned most recently above. In particular, PLC 722 is programmed (like other PLCs) to select either the unregistered output signal of the top-most element 758 or the registered Q output signal of flip-flop 720' for application to the data input terminal of tri-state driver 724. If driver 724 is enabled by the output signal of PLC 732', the signal selected by PLC 722 is applied to I/O pin 710 as a data output signal. PLC 732' can select the tri-state driver control signal from among VCC (i.e., fixed logic 1), the unregistered output signal of the circuit 758 that is fourth from the top, and the registered Q output signal of flip-flop 730'. (VCC is not shown as one of the inputs to PLC 732' in the reference mentioned most recently above. It is added here as an option for use when multiplexing two output signals onto pin 710.)

If I/O cell 630' is used to receive a single data signal via I/O pin 710 (again as described in the reference mentioned most recently above), that data input signal is applied to the D input terminal of flip-flop 740 and also to one input terminal of each of PLCs 742. Flip-flop 740 can register the data input signal, and each of PLCs 742 can output either the registered or unregistered data input signal via the associated driver 744 to the logic or other circuitry of the integrated circuit that includes I/O cell 630' (see again FIG. 4).

When it is desired to multiplex two data output signals onto I/O pin 710, I/O cell 630' is configured and operated as will now be described. PLC 732' is programmed to apply VCC to the control input terminal of tri-state driver 724 so that driver 724 is always enabled. One of the two data signals to be multiplexed is applied to flip-flop 720' for registration by that device. The other of the two data signals to be multiplexed is applied to flip-flop 730' for registration by that device. Thus, what was formerly a register (730') for registering an output enable (tri-state) control signal is effectively "stolen" for use as a second data output signal register. A connection 2020 (described in more detail below) from flip-flop 730' to flip-flop 720' is operative to allow data from register 730' to effectively over-ride the data in register 720' during part of each clock signal cycle. Accordingly, during part of each clock signal cycle, the output signal of register 720' is one of the two data output signals to be multiplexed; and during the other part of each clock signal cycle, the output signal of register 730' is the other of the two data output signals to be multiplexed. I/O pin 710 therefore receives and outputs the two data output signals in time-division multiplexed form. The manner in which this result is achieved will be more apparent from the following discussion of FIG. 2.

Figure 2:
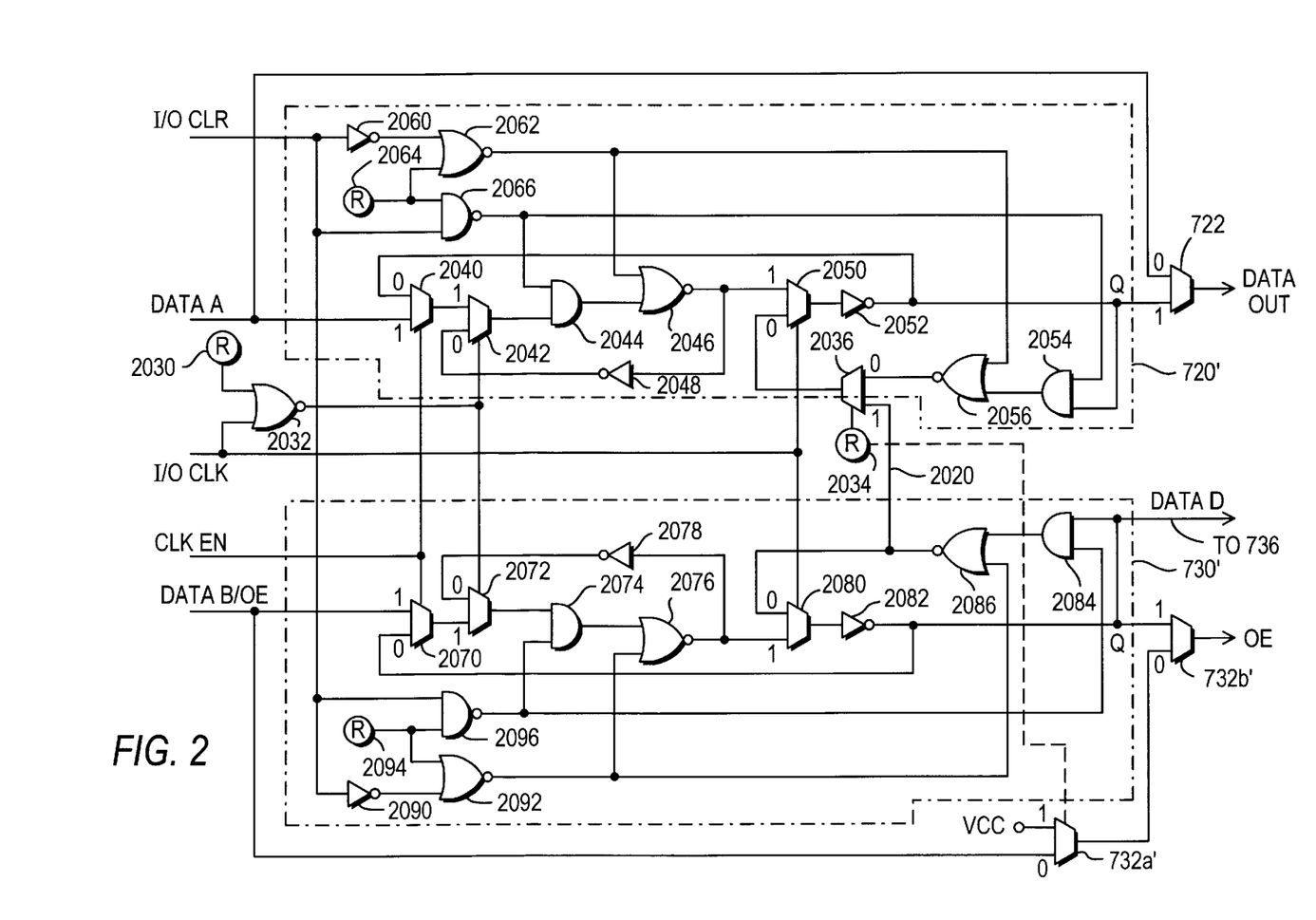
FIG. 2 is a more detailed, but still simplified, schematic block diagram of an illustrative embodiment of portions of the circuitry shown in FIG. 1.

FIG. 2 shows additional details of an illustrative construction of registers 720' and 730' and related circuitry in accordance with the invention. In FIG. 2 chain-dotted line 720' basically surrounds the circuit elements used to implement flip-flop 720', and chain-dotted line 730' basically surrounds the circuit elements used to implement flip-flop 730'. In all cases of interest herein, FCE 2030 is programmed logic 0 and clock enable signal CLK EN is assumed to be logic 1. (Although assumed for simplicity to be logic 1 in the following discussion, the CLK EN signal is in fact operable like a normal clock enable signal regardless of the programmed state of FCE 2030. This will be explained in more detail later in this specification. In will also be noted that although FIG. 2 shows one common CLK EN signal for registers 720' and 730', FIG. 1 shows separate signals of this kind for each register. Either alternative can be used as desired.) A logic 0 output from FCE 2030 causes NOR gate 2032 to invert the I/O CLK clock signal. When the circuitry is not being used to multiplex two data output signals, FCE 2034 is also programmed logic 0 so that both of PLCs 2036 and 732a' always pass the signals from their input leads labeled 0. Programming FCEs 2030 and 2034 as described above allows registers 720' and 730' to operate as separate, conventional, D-type flip-flops.

Considering flip-flop 720' as an example, during the first half of the clock signal cycle in which the DATA A signal has a first data value A1, the I/O CLK signal is high and the output signal of NOR gate 2032 is accordingly low. This prevents data signal value A1 from passing through PLC 2042. (Although referred to for convenience herein as PLCs, elements like 2042 are not programmably controlled by FCEs. Instead, elements like 2042 are controlled by logic or other signals that can change in value during normal operation of the circuitry (e.g., to perform logic). Nevertheless, elements like 2042 can be structurally similar to programmably controlled elements such as 722, 732, 742, 756, etc., and so elements like 2042 are also referred to for convenience as PLCs. Other examples of dynamically controlled elements like 2042 that are called PLCs are 2040, 2050, 2070, 2072, and 2080 (and in FIG. 3, elements 2012, 2142, and 2150).) During the second half of the clock signal cycle in which the DATA A signal has the value A1, the I/O CLK signal is low. This allows data signal value A1 to pass through PLC 2042, AND gate 2044, NOR gate 2046, and inverter 2048. However, the data value A1 cannot pass through PLC 2050 because the I/O CLK signal is low. (Elements 2060, 2062, 2064, and 2066 can be conventional circuitry for use in selectively clearing or presetting register 720'. For present purposes it will be sufficient to assume that these elements always apply gate-enabling signals to all of gates 2044, 2046, 2054, and 2056. The gate-enabling signals thus applied to NOR gates 2046 and 2056 cause those gates to invert the data signals passing through them.)

When the I/O CLK signal next goes high (at the start of the next clock signal cycle), PLC 2042 switches to passing the output signal of inverter 2048, thereby latching data signal value A1 into the "master stage latch" (the closed loop comprising elements 2042, 2044, 2046, and 2048) of register 720'. (It will be understood that the next DATA A signal value A2 is applied to register 720' during this next I/O CLK signal cycle, but this does not affect the master stage latch while it is latched.) As the master stage latches, PLC 2050 begins to pass the A1-valued output signal of the master stage. The A1 signal therefore passes through inverter 2052 to the Q output of register 720', and also through AND gate 2054, NOR gate 2056, and PLC 2036 back to PLC 2050. When the I/O CLK signal next goes low (at the start of the second half of the second clock signal cycle being discussed), PLC 2050 switches to passing the output signal of PLC 2036, thereby latching the A1 signal into the "slave stage latch" (the closed loop comprising elements 2050, 2052, 2054, 2056, and 2036) of register 720'. This transition to a low I/O CLK signal also causes the master stage latch (elements 2042, 2044, 2046, and 2048) to begin to accept data signal value A2. However, this does not affect the slave stage latch (elements 2050, 2052, 2054, 2056, and 2036) while the slave stage is latched.

When the I/O CLK signal next goes high (at the start of a third clock signal cycle), the events described above for the start of the second clock signal cycle are repeated, but for data signal value A2 rather than data signal value A1. In this way the data signal value applied to register 720' during each clock signal cycle is registered and output by that register during the next clock signal cycle. The elements of register 730' operate similarly on an OE signal applied to that register. (Elements in register 730' have reference numbers that are increased by 30 from the reference numbers of the similar elements in register 720'.)

When the circuitry shown in FIG. 2 is to be used to multiplex two output signals (DATA A and DATA B) onto the associated I/O pin 710 (FIG. 1), FCE 2034 is programmed logic 1 and PLC 732b' is programmed to apply the signal on its "0" input lead to the control input terminal of tri-state driver 724 (FIG. 1).

Programming FCE 2034 logic 1 causes each of PLCs 2036 and 732a' to pass the signal applied to the "1" input lead of that PLC. In the case of PLC 732a' this causes VCC to be applied to the control input terminal of tri-state driver 724, thereby rendering that driver constantly enabled.

The DATA A and DATA B signals to be multiplexed are applied in parallel to registers 720' and 730', respectively. When the I/O CLK signal goes low at the start of the second half of the clock signal cycle during which data signal values A1 and B1 are applied, the master stage latch of each register 720' and 730' loads the respective signal value A1 or B1. At the end of that first I/O CLK signal cycle, the master stage latch of each register 720' and 730' latches the respective signal value A1 or B1, and the slave stage latch of each register loads the respective signal value A1 or B1. The Q output signal of register 720' thus becomes A1 for the first half of the second I/O CLK signal cycle.

When the I/O CLK signal next goes low (halfway through the second clock signal cycle), the slave stage latch of register 730' latches signal value B1 and PLCs 2036 and 2050 cause this same signal value B1 to be applied to the Q output of register 720'. In other words, in the programmed state of the circuitry now being described, PLC 2036 and the connection 2020 from register 730' prevent the slave stage of register 720' from latching signal value A1. Instead, these elements cause the B1 signal value latched into the slave stage of register 730' to over-ride signal value A1 in the slave stage of register 720' so that signal value B1 (rather than signal value A1) becomes the Q output of register 720' during the second half of the second clock signal cycle being discussed. In this way the circuitry time-division multiplexes the DATA A and DATA B signals onto I/O pin 710 (FIG. 1) during alternate half cycles of the I/O CLK signal.

Figure 6:
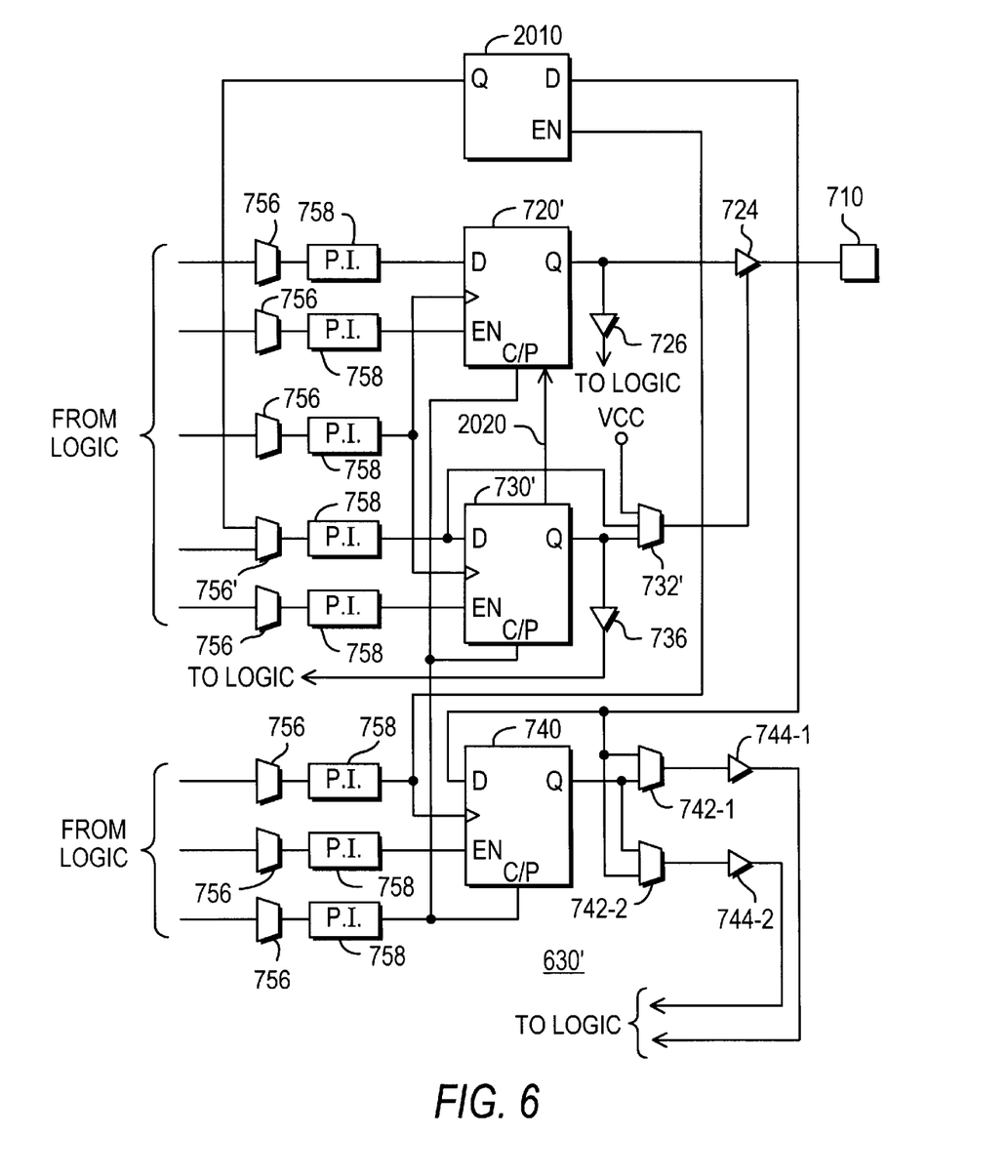
FIG. 6 is similar to FIG. 1, but shows an alternative context in which the invention can be employed.

It will be noted that the PLCs 2036 and 732a' (especially PLC 2036) that have been added to facilitate output signal multiplexing are not in what may be a critical signal speed path in the circuitry. For example, no additional signal switching capability is needed downstream from the Q output of register 720' or the output of PLC 722. Accordingly, when output signal multiplexing is not needed, no additional delay is introduced into the registered or unregistered data signals associated with output data signal register 720'. Indeed, if output signal multiplexing can be provided as an option for an I/O cell 630' for which an unregistered output option is not also needed, then the circuitry shown in FIG. 1 can be modified as shown in FIG. 6 to eliminate all signal switching (other than tri-state driver 724) between the Q output of register 720' and I/O pin 710. In particular, FIG. 6 is the same as FIG. 1 with the exception that the unregistered signal bypass conductor around register 720' and PLC 722 have been eliminated.

Reverting briefly to a discussion of the CLK EN signal in FIG. 2, the clock enable function provided by that signal is still available (as mentioned earlier) even when in I/O signal multiplexing mode. If FCE 2030 is programmed logic 1, then the clock enable signal CLK EN will gate the loading of data into the master latch of the flip-flops. If CLK EN is 1, data will be loaded into the master stage of the flip-flops when the I/O CLK is 0, and then latched by the master stage when the I/O CLK is 1. If CLK EN is 0, the master stage will be latched independent of the value of I/O CLK. Changing CLK EN half-way during a clock cycle has no effect on the transmission of the A or B data stored in the master stage during the last rising transition of I/O CLK when CLK EN was 1. Thus the clock enable function works as one would expect (just as if there were two registered pins, each fed by a clock enable).

Considering now input signal multiplexing (actually demultiplexing) in the context of FIG. 1, level sensitive latch 2010 is connected to I/O pin 710 in parallel with input data register 740. The same signal that clocks register 740 is used as a signal for selectively enabling latch 2010. The same or a closely related clock signal is also used to clock register 730', and these clock signals must also be properly synchronized with the time base or clock of the multiplexed input signals received via I/O pin 710.

PLC 756' is programmed to apply the output signal of latch 2010 to the D input terminal of register 730'. The Q output terminal of register 730' has a connection via PLC 736 to the other circuitry ("logic") of the integrated circuit device that includes I/O cell 630' (see FIG. 4). Flip-flop 740 operates to store the input signal values (sometimes referred to elsewhere as DATA C signal values or samples) which are applied to I/O pin 710 during one half of each clock signal cycle.

Latch 2010 operates to store the input signal values (sometimes referred to elsewhere as DATA D signal values or samples) which are applied to I/O pin 710 during the other half of each clock signal cycle. The data stored by latch 2010 is subsequently transferred to register 730' so that it can be read out in parallel (to the logic or other circuitry of the device that includes I/O cell 630') with the data stored in register 740. Accordingly, the multiplexed input data (DATA C and DATA D) applied to I/O pin 710 is demultiplexed by I/O cell 630' and fed out to the associated logic or other circuitry in parallel.

Figure 3:
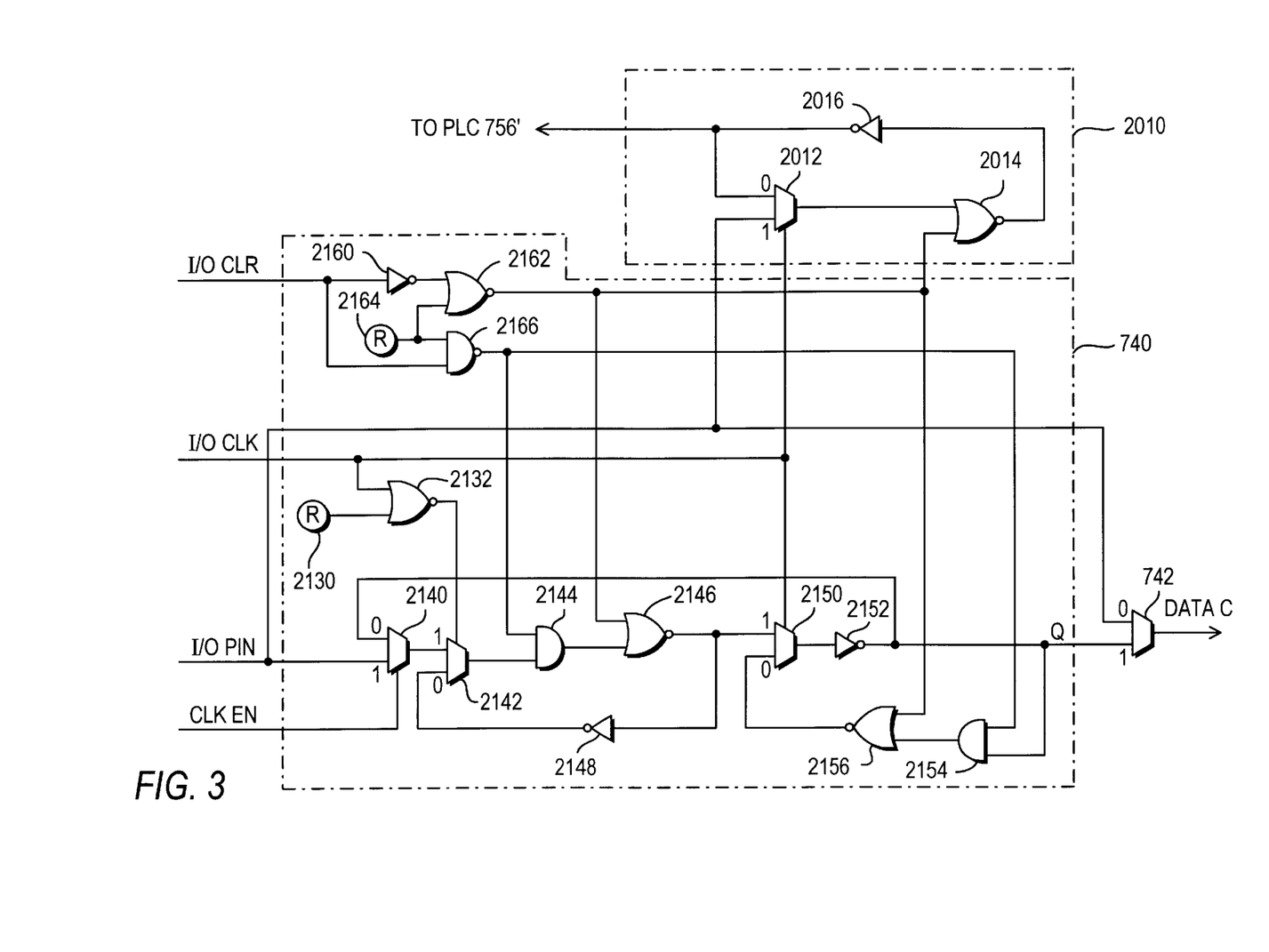
FIG. 3 is a more detailed, but still simplified, schematic block diagram of an illustrative embodiment of other portions of the circuitry shown in FIG. 1.

FIG. 3 shows an illustrative embodiment of elements 740 and 2010 in more detail. As shown in FIG. 3, register 740 can be constructed and operated similarly to register 720' (without including PLC 2036). Elements in FIG. 3 that are similar to elements in FIG. 2 have reference numbers that are increased by 100 from the corresponding FIG. 2 reference numbers. It will thus not be necessary to specifically discuss each element in the FIG. 3 depiction of register 740. It should be noted, however, that the master stage latch of register 740 loads a signal from I/O pin 710 during the second (low) half of each I/O CLK signal cycle, and that it latches that signal during the subsequent first (high) half of the next I/O CLK signal cycle. This is also when the slave stage of register 740 loads the master stage output signal, and the slave stage holds and outputs (as Q) that signal throughout that next I/O CLK signal cycle. Assuming that values of the DATA C signal are applied to pin 710 during the second (low) half of each I/O CLK signal cycle, register 740 will pick off each such value and output it during the next I/O CLK signal cycle.

Latch 2010 includes PLC 2012, NOR gate 2014, and inverter 2016. As long as the I/O CLK signal is high, PLC 2012 passes the I/O PIN input signal to elements 2014 and 2016. As soon as the I/O CLK signal goes low, latch 2010 latches in the last I/O PIN signal value that it received. The latched signal is applied to register 730' via PLC 756'. Register 730' registers that signal and thereby makes it available as the DATA D output signal of I/O cell 630'.

From the foregoing, it will be seen that elements 740 and 2010/730' capture input data signals from I/O pin 710 during different halves of each clock signal cycle. Latch 2010 captures I/O pin signals from the high half of each clock signal cycle, and register 740 captures I/O pin signals from the low half of each clock signal cycle. This enables I/O cell 630' to demultiplex two data signals (DATA C and DATA D) that have been received via I/O pin 710 in time-division multiplexed form in alternate half cycles of the clock signal. Note that again tri-state control signal register 730' is effectively "stolen" for use in registering the second data signal (DATA D) when I/O pin 710 is to be used for multiplexed input signals.

Figure 4:
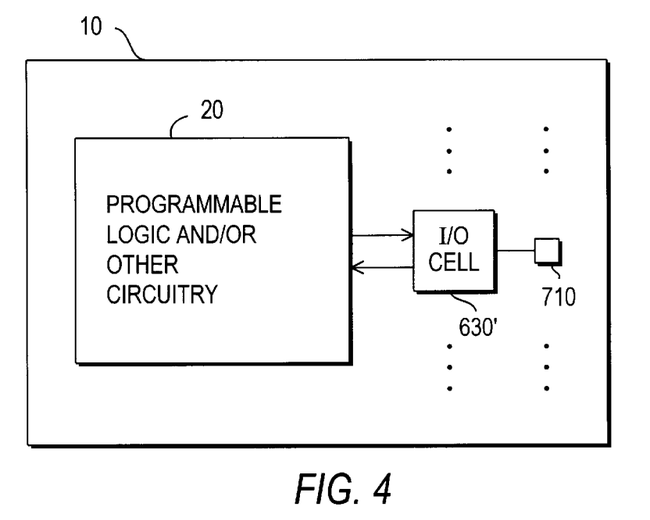
FIG. 4 is a simplified block diagram of an illustrative embodiment of an integrated circuit employing circuitry of the type shown in FIG. 1 in accordance with the invention.

For completeness, FIG. 4 shows an integrated circuit 10 that includes programmable logic and/or other circuitry 20, representative I/O cell 630' coupled to circuitry 20, and representative I/O pin 710 coupled to I/O cell 630'. As was mentioned earlier in this specification, circuitry 20 can be circuitry of the type shown in the reference identified most recently above. Alternatively, any other suitable circuitry 20 can be used on device 10 in conjunction with elements 630' and 710.

Figure 5:
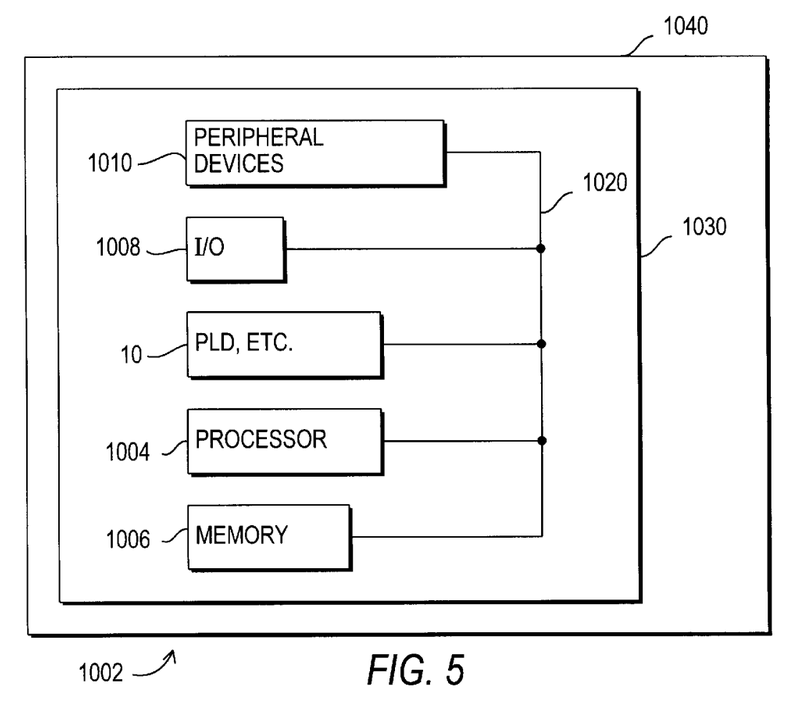
FIG. 5 is a simplified block diagram of an illustrative system employing an integrated circuit of the type shown in FIG. 4 in accordance with the invention.

FIG. 5 illustrates an integrated circuit device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using device 10 (including programmable or reprogrammable I/O cells 630', and possibly also including other programmable or reprogrammable circuitry such as logic) is desirable. Device 10 can be used to perform a variety of different functions. For example, device 10 can be configured as a processor or controller that works in cooperation with processor 1004. Device 10 may also be used as an arbiter for arbitrating access to a shared resource in system 1002.

In yet another example, device 10 can be configured as an interface between processor 1004 and one of the other components in system 1002. It should be noted that system 1002 is only exemplary, and that the true scope and spirit of the invention should be indicated by the following claims.

Various technologies can be used to implement devices 10 having the I/O cell features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, as an alternative to using tri-state driver control signal register 730' as a second output data signal register or as a second input data signal register, input register 740 could be used as a second output data register, or output data register 720' could be used as a second input data register. This would leave register 730' available for use in tri-state driver control even during signal multiplexing operation of the I/O cell. These alternatives could be implemented by adding an extra two-to-one multiplexer to the input of both the input and output registers which would select from either the I/O pin or an output signal. A possible disadvantage of this implementation would be that it adds an extra two-to-one multiplexer delay to the register's set-up time. Another possibility is not to re-use register 730', but to add one or two extra registers to the I/O cell. This would be more expensive, but it would allow a registered tri-state pin to be combined with both a double-time input and output, all simultaneously on the same pin.

What is claimed is:

1. Programmable output circuitry for use in an integrated circuit comprising:
   output pin circuitry;
   first register circuitry including first master latching circuitry and first slave latching circuitry and configured to normally receive and latch a first output data signal via the first master latching circuitry and to pass that first output data signal to the first slave latching circuitry for latching by the first slave latching circuitry and output to the output pin circuitry;
   second register circuitry including second master latching circuitry and second slave latching circuitry and configured to normally receive and latch a second signal via the second master latching circuitry and to pass that second signal to the second slave latching circuitry for latching and output by the second slave latching circuitry; and
   programmable logic connector circuitry configured to selectively substitute the signal output by the second slave latching circuitry for the signal normally latched by the first slave latching circuitry without altering the ability of the first slave latching circuitry to output the first output data signal passed from the first master latching circuitry when the first slave latching circuitry is not latched.

2. The programmable output circuitry defined in claim 1 wherein the output pin circuitry comprises:
   an output pin; and
   tri-state driver circuitry configured to selectively apply to the output pin the signal output by the first slave latching circuitry.

3. The programmable output circuitry defined in claim 2 wherein the second register circuitry is configured to normally store and output the second signal as a tri-state driver control signal for selectively enabling the tri-state driver circuitry.

4. The programmable output circuitry defined in claim 3 further comprising:
   programable circuit elements configured to selectively substitute a fixed tri-state driver enabling signal for the tri-state driver control signal output by the second register circuitry.

5. The programmable output circuitry defined in claim 1 wherein the first register circuitry is configured so that when the programmable logic connector circuitry is operating to substitute the signal output by the second slave latching circuitry, the first slave latching circuitry outputs to the output pin circuitry the signal passed by the first master latching circuitry during a first half of a clock signal cycle, and the first slave latching circuitry outputs to the output pin circuitry the signal output by the second slave latching circuitry during a second half of the clock signal cycle.

6. The programmable output circuitry defined in claim 5 wherein all of the master and slave latching circuitries are configured for latching in response to the clock signal.

7. The programmable output circuitry defined in claim 1 further comprising:
   third register circuitry configured to selectively latch a first sample of an input signal applied to the output pin circuitry during a first half of a clock signal cycle; and
   fourth register circuitry configured to selectively latch a second sample of an input signal applied to the output pin circuitry during a second half of the clock signal cycle.

8. The programmable output circuitry defined in claim 7 wherein the third and fourth register circuitries are further configured for latching in response to the clock signal.

9. The programmable output circuitry defined in claim 7 further comprising:
   programmable routing circuitry configured to selectively route the signal latched by the fourth register circuitry to the second register circuitry as the second signal.

10. An integrated circuit comprising:
    the programmable output circuitry defined in claim 9;
    signal utilization circuitry; and
    signal conveying circuitry configured to apply signals output by the third register circuitry and the second slave latching circuitry to the signal utilization circuitry.

11. The integrated circuit defined in claim 10 wherein the signal utilization circuitry includes programmable logic circuitry.

12. An integrated circuit comprising:
    the programmable output circuitry defined in claim 1; and
    signal source circuitry configured to produce the first output data signal and the second signal.

13. The integrated circuit defined in claim 12 wherein the signal source circuitry includes programmable logic circuitry.

14. An integrated circuit comprising:
    the programmable output circuitry defined in claim 1.

15. A digital processing system comprising:
    processing circuitry;
    a memory coupled to the processing circuitry; and
    an integrated circuit as defined in claim 14 coupled to the processing circuitry and the memory.

16. A printed circuit board on which is mounted an integrated circuit as defined in claim 14.

17. The printed circuit board defined in claim 16 further comprising:
    a memory mounted on the printed circuit board and coupled to the integrated circuit.

18. The printed circuit board defined in claim 16 further comprising:
    processing circuitry mounted on the printed circuit board and coupled to the integrated circuit.

* * * * *